United States Patent

Pulker et al.

[11] 4,173,522
[45] Nov. 6, 1979

[54] METHOD AND APPARATUS FOR PRODUCING CARBON COATINGS BY SPUTTERING

[75] Inventors: Hans K. Pulker, Triesen, Liechtenstein; Reinhard Staffler, Feldkirch, Austria

[73] Assignee: Balzers Patent- und Beteiligungs-Aktiengesellschaft, Liechtenstein

[21] Appl. No.: 831,132

[22] Filed: Sep. 7, 1977

[30] Foreign Application Priority Data

Sep. 9, 1976 [CH] Switzerland ............... 011424/76

[51] Int. Cl.² ............................................. C23C 15/00
[52] U.S. Cl. .............................................. 204/192 C
[58] Field of Search ......... 204/192 C, 192 E, 192 EC

[56] References Cited

U.S. PATENT DOCUMENTS 3,813,282   5/1974   Masotti et al. ............ 204/192 E
3,846,294   11/1974  Vossen .................... 204/192 EC

OTHER PUBLICATIONS

Handbook of Chemistry and Physics; Chemical Rubber Company 45th Edition, 1964–1965; p. F1.

Primary Examiner—John H. Mack
Assistant Examiner—William Leader
Attorney, Agent, or Firm—McGlew and Tuttle

[57] ABSTRACT

A method for producing carbon coatings by sputtering comprises placing the target material to be sputtered which is made of a fibrous carbon material such as paper, velvet, wood, etc. which has been charred on the cathode. The apparatus comprises an electrode forming an anode which is arranged in spaced relationship to a cathode.

1 Claim, 1 Drawing Figure

U.S. Patent            Nov. 6, 1979            4,173,522
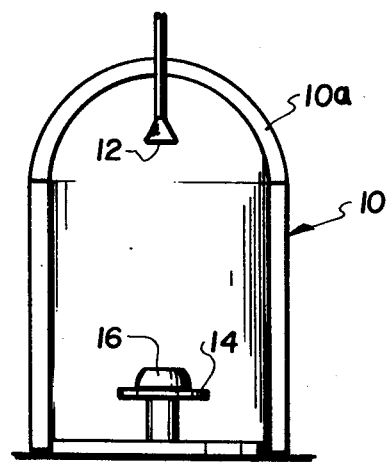

METHOD AND APPARATUS FOR PRODUCING CARBON COATINGS BY SPUTTERING

BACKGROUND OF THE INVENTION

1. Field of the Invention

The present invention relates in general to the deposition of carbon coatings on substrates by carbon sputtering through ion bombardment and to a new and useful device and method for producing carbon coatings by sputtering.

2. Description of the Prior Art

Because of their resistance to most of the chemical agents and to high temperatures, carbon coatings are applicable to many purposes, for example, they are largely used as protective layers, for electrical layer resistors, as well as in the technique of making preparations for electron microscopes.

The sputtering of substances through ion bombardment in an electrical gas discharge or by ions from a so-called ion gun, and depositing of the sputtered particles on a substrate to form a coating, has been well known for a long time. This method has proved satisfactory particularly in the form of a so-called cathode sputtering. Most of the solid substances can be sputtered, among them also the metals difficult to fuse because of the required high temperatures, such a molybdenum or tungsten. With carbon, however, the experience has been, up to the present time, that in the usual manner, this substance is very difficult to sputter, irrespective of the discharge conditions, i.e. the voltage and amperage of the discharge current, pressure in the sputtering space, or gas in which the sputtering takes place. Therefore, the sputtering rate obtainable with carbon has not been interesting for most of the technical applications. On the other hand, for many purposes, carbon layers deposited in this way would be more satisfactory than layers deposited by vacuum evaporation, since in a sputtering process, they can be made denser and more uniform. In spite of that, carbon layers have hitherto been produced frequently by evaporation of carbon between carbon electrodes or by means of an electron gun.

SUMMARY OF THE INVENTION

The present invention is directed to a method and apparatus for permitting the sputtering of carbon by ion bombardment at substantially improved rate. To this end, in accordance with the invention, in a process of producing carbon coatings in which a target material is sputtered by ion bombardment and the carbon particles are deposited on the substrate to be coated, it is provided to use a fibrous carbon body as the target material.

Accordingly it is an object of the invention to provide the use of a fibrous carbon body as a target for the production of carbon coatings by sputtering the target material through ion bombardment and depositing the carbon partices on the substrate to be coated.

A further object of the invention is to provide a method of depositing carbon coatings on substrates by carbon sputtering which comprises placing the target material to be sputtered on an electrode forming the cathode and then coating the substrate with the carbon by sputtering.

A further object of the invention is to provide a device for depositing carbon coatings on substances which is simple in design, rugged in construction and economical to manufacture.

The various features of novelty which characterize the invention are pointed out with particularity in the claims annexed to and forming a part of this disclosure. For a better understanding of the invention, its operating advantages and specific objects attained by its uses, reference should be had to the accompanying drawing and descriptive matter in which there is illustrated a preferred embodiment of the invention.

BRIEF DESCRIPTION OF THE DRAWINGS

In the drawings:

The only FIGURE of the drawings is a sectional view of a sputtering device constructed in accordance with the invention.

GENERAL DESCRIPTION OF THE PREFERRED EMBODIMENT

Referring to the drawing in particular the invention embodied therein comprises a sputtering device generally designated 10 including a housing 10a which is adapted to be evacuated and which contains a first electrode 12 forming an anode and a second electrode 14 forming a cathode. In accordance with the invention a target 16, to be bombarded and sputtered, is made of a fibrous material and is supported on the cathode 14.

In accordance with the method of the invention, the target 16 is placed on a cathode and sputtering is carried out by energizing the anode and the cathode to form a carbon coating on a substrate material.

Tests have shown that this method makes it possible to increase the coating rate, i.e. the thickness of the layer which can be deposited per second on a substrate with a specified sputtering equipment, many times over the rate attainable with the method of the prior art. It has been proved particularly suitable to use fibrous carbon bodies 16 obtained by charring a fibrous material such as paper, velvet, or wool. The material is charred in a well-known manner, by heating under exclusion of air.

Fibrous carbon bodies suitable as target materials for purposes of the invention are commercially available. They are sold, for example, as graphite foils for sealing purposes and as graphite felt. Their macroscopic density is lower than that of solid carbon. For the present purpose, densities of less than 2 grams per $cm^3$ are particularly advisable.

The technological progress obtained by the invention is evident from the fact that in a specific cathode sputtering apparatus, under chosen optimal operational conditions, and with a definite spacing of the target from the surface to be coated, while using an ordinary, commercially available, massive graphite body as the target, a sputtering rate of 1.5 to 2 nm per minute has been achieved. In contrast thereto, while using a target material as provided in the invention, i.e. a graphitized foil having a density of 1.1 gram per $cm^3$ and the same target area, it has been possible to attain a rate of 7 to 8 nm per minute. In this latter case, the sputtering has been effected with a discharge current of 35 mA and a voltage between target (cathode) and anode of 2 kV.

As known per se, in the cathode sputtering process, care must be taken of having a satisfactory thermal contact between the target or material to be sputtered and the electrode supporting this material.

There is no theoretical explanation as yet for the surprising result obtained by the invention.

While a specific embodiment of the invention has been shown and described in detail to illustrate the application of the principles of the invention, it will be understood that the invention may be embodied otherwise without departing from such principles.

What is claimed is:

1. A method of forming a carbon coating on a substrate comprising placing a fibrous carbon material having a density of less than 2 grams per cubic centimeter on an electrode forming a cathode which is spaced away from an electrode forming an anode and energizing the electrodes to deposit the carbon material on the substrate by sputtering.

* * * * *